United States Patent [19]

Segelken et al.

[11] Patent Number: 5,420,754
[45] Date of Patent: May 30, 1995

[54] STACKED BOARD ASSEMBLY FOR COMPUTING MACHINES, INCLUDING ROUTING BOARDS

[75] Inventors: John M. Segelken, Morristown; Richard R. Shively, Convent Station, both of N.J.; Christopher A. Stanziola, Hyde Park, N.Y.; Lesley J. Wu, Denville, N.J.

[73] Assignee: AT&T Corp., Murray Hill, N.J.

[21] Appl. No.: 590,246

[22] Filed: Sep. 28, 1990

[51] Int. Cl.6 .................... H01L 23/16; H05K 1/04
[52] U.S. Cl. ...................... 361/735; 361/719; 361/749; 365/13; 365/69; 364/249.2
[58] Field of Search .............. 395/800; 361/403, 410, 361/412, 719, 735, 749; 365/13, 69

[56] References Cited

U.S. PATENT DOCUMENTS

| | | | |
|---|---|---|---|
| 3,923,359 | 12/1975 | Newsam | 439/75 |
| 4,739,474 | 4/1988 | Holsztynski | 395/800 |
| 4,891,751 | 1/1990 | Call et al. | 395/800 |
| 4,891,789 | 1/1990 | Quattrini et al. | 365/63 |
| 4,907,128 | 3/1990 | Solomon et al. | 361/412 |
| 4,942,550 | 7/1990 | Murray | 395/275 |
| 4,953,005 | 8/1990 | Carlson et al. | 357/80 |
| 4,967,314 | 10/1990 | Higgins, III | 361/414 |
| 5,020,059 | 5/1991 | Gorin et al. | 371/11.3 |
| 5,038,386 | 8/1991 | Li | 382/49 |
| 5,058,001 | 10/1991 | Li | 395/500 |
| 5,089,880 | 2/1992 | Meyer et al. | 257/692 |

Primary Examiner—Parshotam S. Lall
Assistant Examiner—Krisna Lim
Attorney, Agent, or Firm—Charles E. Graves; Martin I. Finston

[57] ABSTRACT

A system is described for arraying multi-device processing nodes in a 3-dimensional computing architecture and for flexibly connecting their ports. The topology of each processing node is of a fixed and constant physical geometry. The nodes may comprise a digital signal processor chip, a static RAM, and a communications and network controller. The nodes are mounted on boards. Selective connection of ports of each board to ports of another adjacent board is effected by a routing and spacer element having internal routing paths.

12 Claims, 10 Drawing Sheets

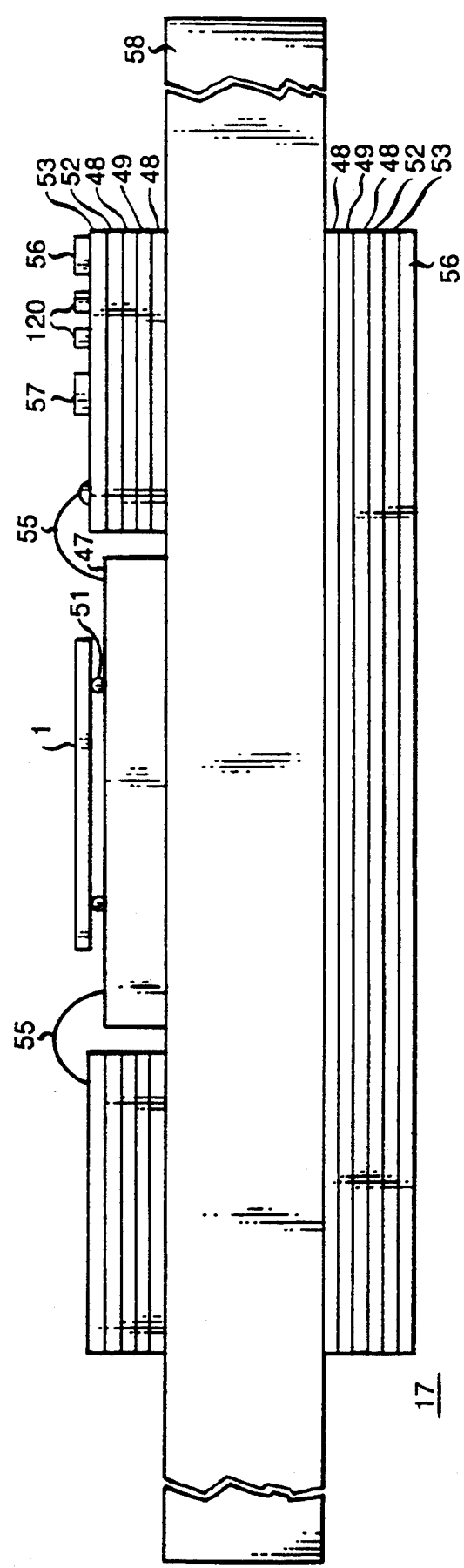

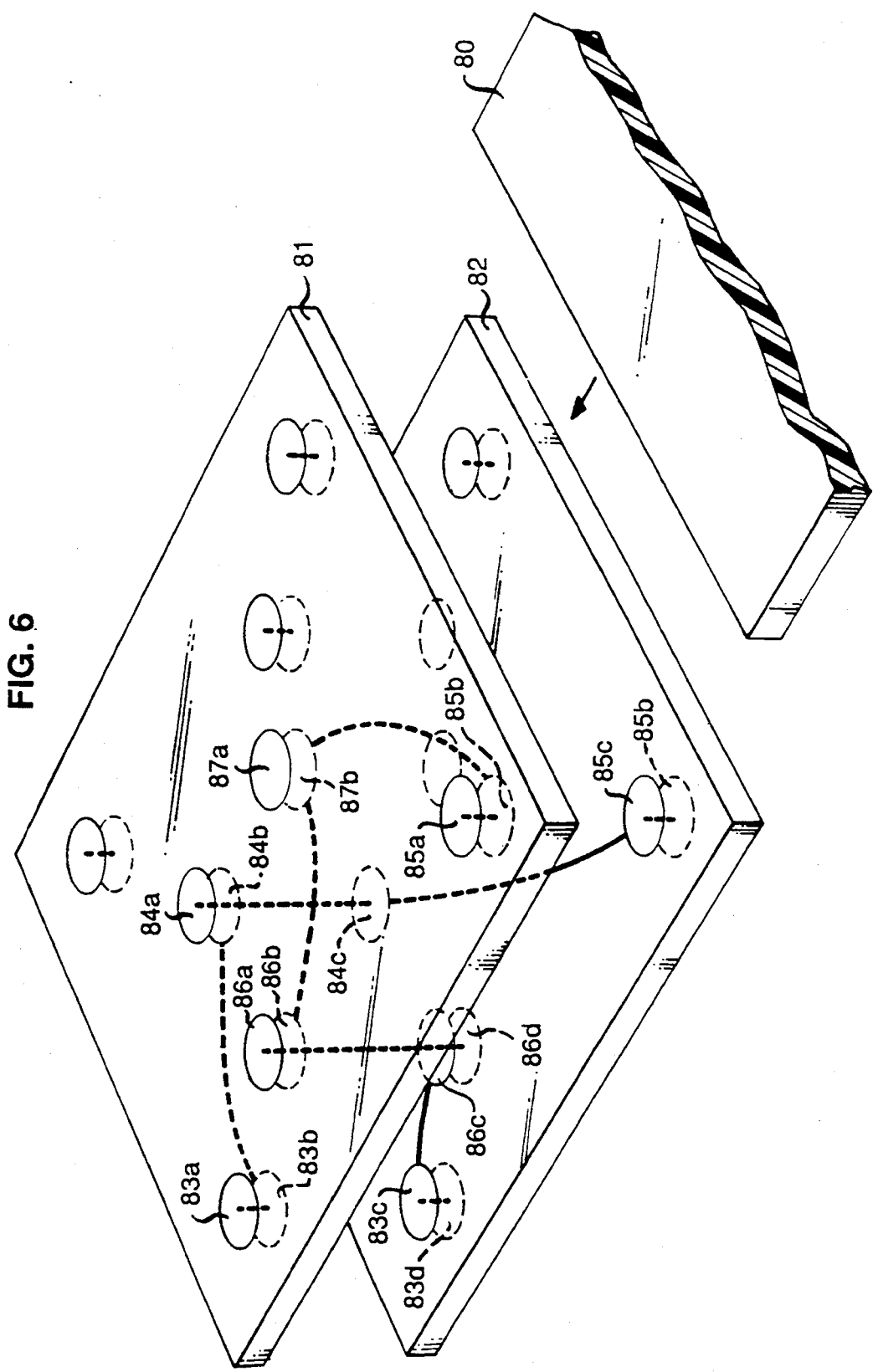

"1-4" RING

STACKED BOARD ASSEMBLY FOR COMPUTING MACHINES, INCLUDING ROUTING BOARDS

FIELD OF THE INVENTION

This invention relates to multiprocessor computers and, in particular, to high throughput, high density computers configured from the stacking of several multi-chip processor boards.

BACKGROUND OF THE INVENTION

Multiprocessor computer architectures typically arc realized by connecting planar arrays of separate processor boards together through a backplane bus. The processors are board-mounted microchips located along with other chips at computing nodes. Several nodes are located on each board. The node arrays may be under the control of a "host" computer. Alternatively, the nodes may be synchronized by the input data itself.

Node interconnection configurations must be varied to suit a particular application, for example, to form a systolic or linear array for efficiently solving particular problems.

Spatial efficiency is critically necessary in multiprocessor computers. Although some spatially efficient multiprocessor computing: structures are disclosed in the prior art, it is desirable to pack still more computing capacity into smaller volumes.

One possible structure for achieving smaller volumes is a stacked processor board array, wherein the processors are rectangular 4-ported chips with the ports typically denoted north, east, west, and south. These board modules are termed "Multi-chip Modules", or "MCMs". The boards can be stacked and electrically connected as described in U.S. Pat. No. 5,049,982 assigned to applicants' assignee.

The electrical pathing disclosed in the cited patent application of Lee et al. 1-6 does not afford sufficiently flexible routing options, however. Realizing a large number of possible computing architectures inexpensively in a standardized stacked modular regime requires that the processors of the standard hardware elements be interconnectable with as much variability as possible.

One factor which makes routing flexibility difficult to achieve is that the routing of signals to and from the processors of the stacked array is more complex than routing in two dimensions. Routing path crossover problems are an example. Present approaches to avoiding crossover problems, which occur in routing between and among processor elements of stacked boards, tend to create paths that am circuitous, heat-generating, and space-inefficient.

Accordingly, one object of the invention is to maximize the number and variety of possible computing architectures that can be realized in a stacked-board multiprocessor.

Another object of the invention is to increase the computing density (computing power per unit physical volume) of a multiprocessor computer.

A further object of the invention is to provide a multiprocessor computer of high density, which is also scalable to meet a wide range of computing applications.

SUMMARY OF THE INVENTION

Interlayer node configuring in a stacked board multiprocessor computer is achieved, in accordance with the invention, by a unique inter-board routing/spacer element (hereinafter, "RS"), which has internal circuit paths. The internal paths effect connections between selected ports of processors in adjacent boards.

The RS element contains fields of contact pads and routing pads, in which the pads are in vertical alignment with corresponding pads along the periphery of each stacked board. The RS element allows for vertical straight-through connection of contact pads of stacked boards. Additionally; selected contact pads of the non-contact areas of a given MCM board are connected to other, vertically aligned contact pads of the adjacent stacked board through routing paths tailored to a particular RS element. The pads of the stacked boards, which are thus connected, are not in vertical alignment.

The invention makes possible a far more efficient realization of certain processor element interconnection architectures. In one such embodiment, a "TORUS" architecture is created with a first arrangement of the cross-paths of the RS element. In this architecture, every vertically aligned group of processing elements is connected in a ring, and every co-planar group of processing elements is connected in a ring as shown, for example, in FIG. 9. In another embodiment, a "1-4" ring topology is achieved using only a slight structural variant of the RS element, with other components being structurally the same as for the TORUS architecture. Further illustrative embodiments of the novel RS element, and node architectures, are also taught.

BRIEF DESCRIPTION OF THE DRAWING

FIG. 3 is a partial sectional side view showing the layer structure of a board and the mounting of tiles thereon;

FIG. 6 is an exploded front perspective view of an RS element, showing internal route paths;

DETAILED DESCRIPTION OF AN ILLUSTRATIVE EMBODIMENT

Figure 1:
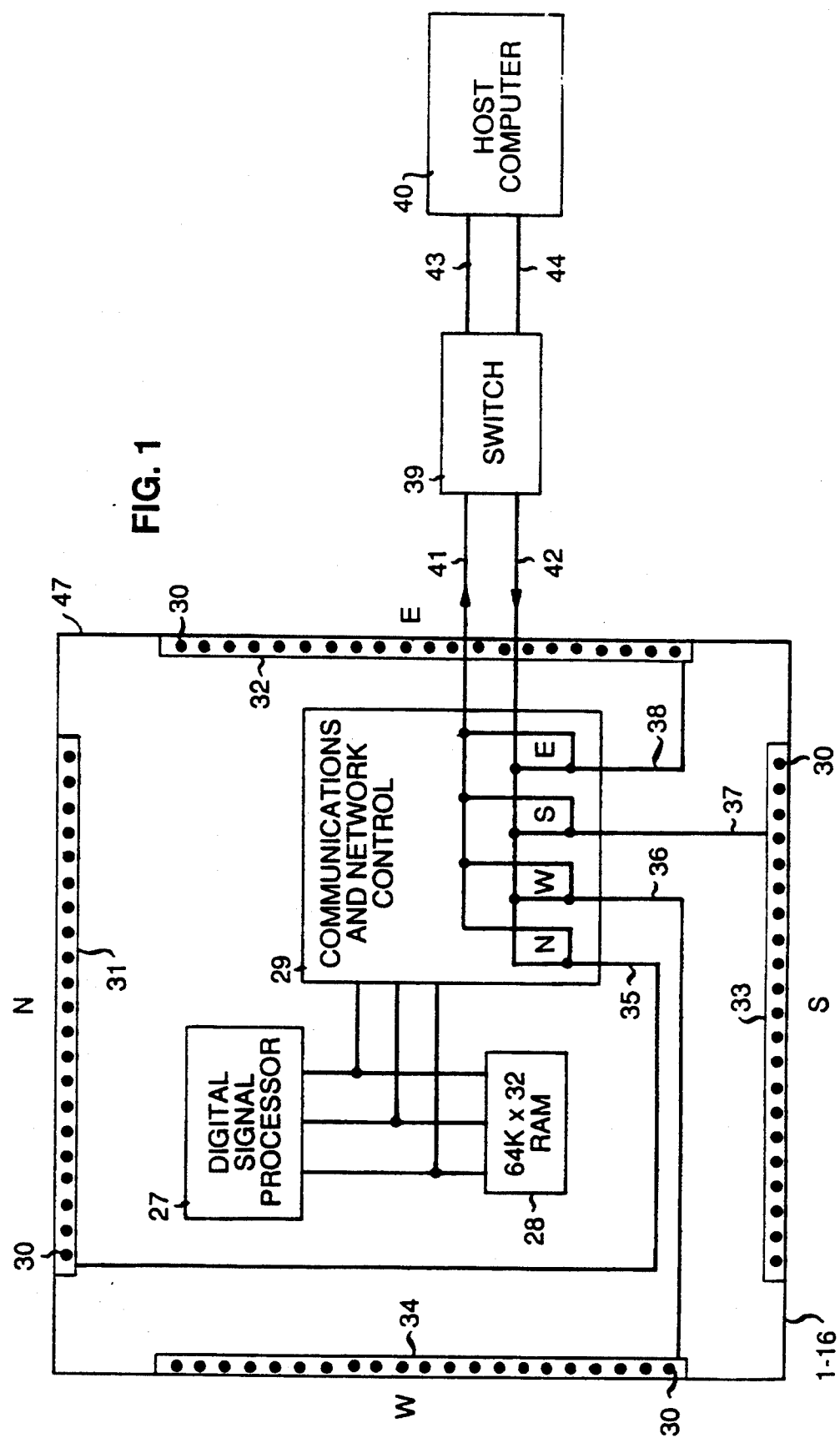
FIG. 1 is a top schematic view of a processing tile and associated computer.

The processors, which the present invention helps to interconnect, are each a multi-device processing node such as the node shown in FIG. 1. The topology of each processing node is of a fixed and constant physical geometry. These nodes, denoted 1 through 16 in the node architecture illustrated, for example, in FIGS. 8, 9, and 10, each comprise a digital signal processor chip 27, a static 64KX32 RAM 28, and a communications and network controller 29. The nodes are hereinafter referred to as processing tiles, or "PEs".

The PEs 1-16 of the present invention are 4-sided. As shown in FIG. 1, the sides or edges of each PE provide a set of connections, denoted 31, 32, 33, 34. These connections 31-34 are access ports to and from each PE. The ports of the four sides of each PE are conventionally preferred to in the art as: north, east, south, and west ports, or simply "N", "E", "S", and "W". The ports supported by the connections 31-34 are so labeled in FIG. 1 and elsewhere.

The connections 31-34 of ports N, E, S, W, consist of plural wire bonding pads 30 on each MCM, and provide different signal paths to and from the components of the PE. Specific paths are accessed by connections to specific metal pads 30. The connections 31, 32, 33, 34 are connected respectively to a communications and network controller 29 by busses 35, 36, 37, and 38. The busses provide data links and control links.

Controller 29 of each PE 1-16 is connected to an external device such as a host computer 40 or an I/O peripheral, through a switch 39, which advantageously is a solid state ASIC device. The paths 41 and 42 provide a means for connecting switch 39 to the elements 31-34. The paths 41, 42 are bi-directional, so that either may be an input or an output path. The selection of a particular port connection scheme is dependent on the intended node architecture.

Metal Core Board Structure and Processor Tiles

Figure 2:
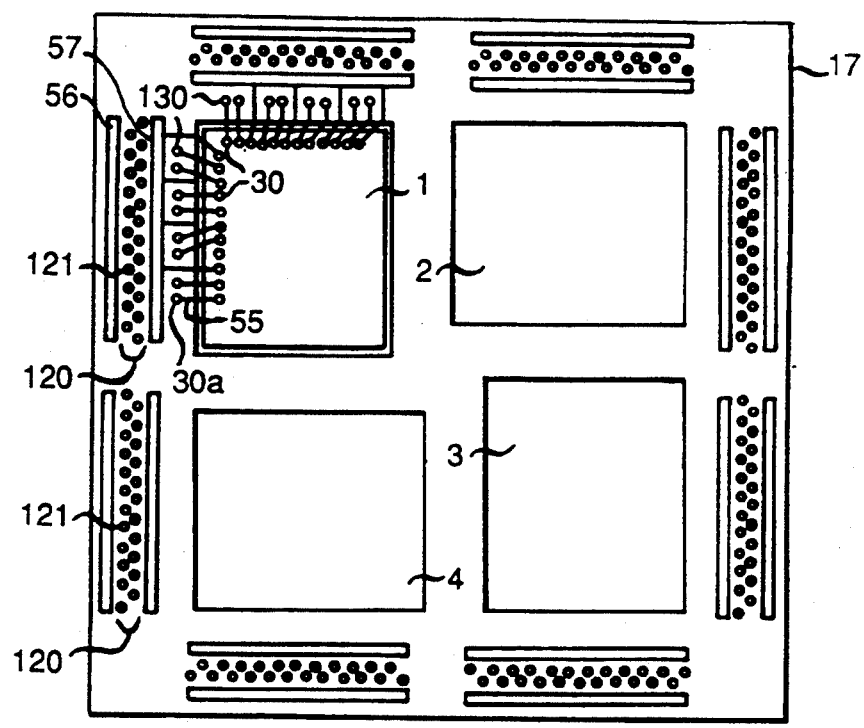
FIG. 2 is a top schematic view of a 4-tile board, showing electrical connection means.
Figure 4:
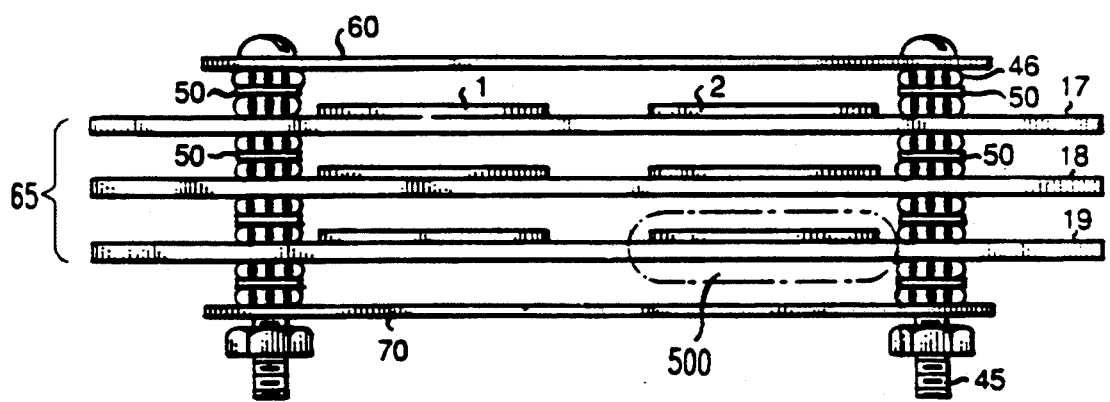
FIG. 4 is a schematic side view illustrating the stacking of boards.
Figure 4A:
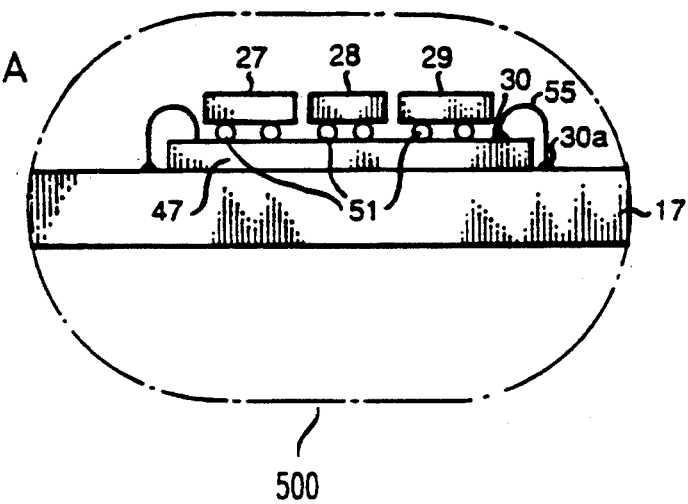
FIG. 4A is an enlarged view of region 500 of FIG. 4.

FIGS. 2, 3, and 4 further illustrate the board structure with which the present invention is practiced. In FIG. 2, a processor board 17, a Multi-Chip Module, mounts four PEs, denoted 1, 2, 3, and 4. The contact pads 30 on PE 1 are wire-connected to corresponding contact pads 130 in a field on board 17. Other wire connections (for clarity, not shown) are effected from pads 30 on PE 1 to the ground bus 56 and also to the power bus 57 on board 17.

FIG. 3 shows details of the board 17 structure. A metal core 58 serves as a heat extractor and the MCM carrier; and is electrically tied to ground. An insulating layer 48 is placed on the core's top and bottom surfaces. Outwardly of each layer 48 is a copper foil 49 which serve as power and ground planes respectively. Next, second insulative layers 48 are formed over the foil 49. The next outward layer comprises a matrix 52 of insulated small-diameter wires embedded in an epoxy. The wires (not shown in FIG. 3) provide interconnections between contact fields and MCMs. An encapsulate (not shown) is applied to the layer 52.

Next, a cap layer 53 is formed. Openings for plated-through holes are formed to make connections to the wires in the matrix layers 52. Surface metalization and contacts, as needed, denoted 56, are formed on the outer surface of layer 53.

PEs, such as the PE 1, are electrically and mechanically mounted to a silicon substrate 47 on board 17 with solder bumps 51. Substrate 47 is affixed to the core of board 17 with thermally and electrically conductive epoxy. Connections such as the wires 55 are made from designated pads 30 (FIGS. 1 and 2) to sites on the metalization layer 56.

Figure 5:
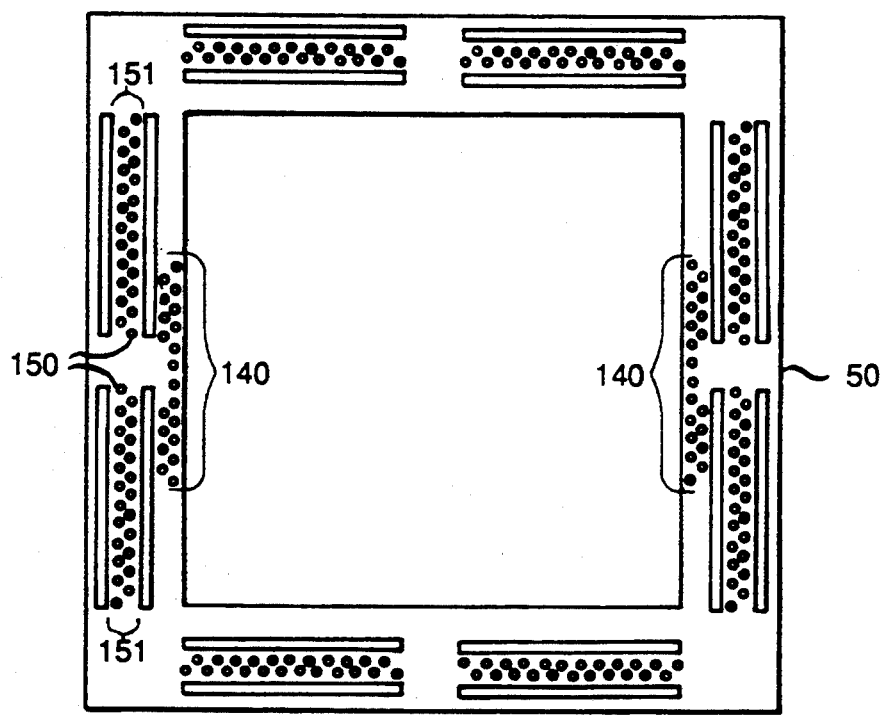
FIG. 5 is a top schematic view of an RS element.

Referring to FIG. 2, contact pads such as pad 121 are arrayed in fields denoted 120. Fields 120 are disposed near the four respective edges and on either side of board 17. Selected ones of the corresponding pads are electrically joined by conventional plated-through holes (not shown in FIG. 2). Similarly, as seen in FIG. 5, contact pads such as pad 15 1 are arrayed in fields denoted 150 on the RS element 50. The fields 150 are disposed near the four respective edges and on either side of RS 50. Selected ones of the corresponding pads are joined by conventional plated-through holes. The selected vertically aligned pads on board 17 and on RS 50, which are so connected, provide vertical point-to-point interconnection between corresponding PEs of the stack of boards 17.

Pursuant to the invention, certain non-vertical interconnections required between N and S ports of vertically adjacent PEs, are made by creating routing paths in the interior of the RS element 50. These routing paths are to connect selected contact pads of PEs on different boards, by making connections between contact pads in the contact fields 130 of the stacked boards 17, 18, 19, 20 which cannot be connected through a straight vertical path. The routing paths are created in the RS 50 between upper and lower contact pads in the routing fields 140, as will now be described in conjunction with FIG. 6.

RS Element Structure

FIG. 6 is a partial sectional view of the routing fields of RS 50 shown in FIG. 5. RS 50 is constructed of top and bottom laminates 81, 82 separated by insulative layer 80. The exterior surface of laminates 81, 82 contain contact pads which are in spatial alignment with some of the contact pads in the contact fields 120 (FIG. 2) of the board such as board 17. Sets of vertically aligned contact pads such as 83a, 83b, 83c, 83d, are formed on the surfaces of laminates 81, 82, with pads 83a and 83d being on exterior surfaces, and pads 83b, 83c being on interior surfaces. It should be noted that in this example, pads 83 is insulated from pad 83c; likewise, 85b is insulated from pad 85c.

To construct, for example, a path between exterior pad 83a of laminate 81, and exterior pad 85d of laminate 82, vertical connections are made with plated-through holes (PTH) and horizontal connections are made with etched conductive paths (ECP). Specifically, a PTH is effected between pads 83a and 83b; an ECP between pad 83b and pad 84b; a PTH between pad 84b and pad 84c; an ECP between pad 84c and pad 85c; and a PTH between pad 85c and pad 85d.

Similarly, to construct a path between exterior pad 85a and exterior pad 83d, a PTH is effected between pads 85a and 85b; an ECP is made between pads 85b and 87b; another ECP is made between pads 87b and 86b; electrical contact is made by plated through hole between pads 86b and 86c; an ECP is made between pads 86c and 83c; and finally a PTH is made between pads 83c and 83d.

One of the advantages of the above-described RS element is that the intersecting of two (or more) routing paths, which might occur if the horizontal route-switching were to occur in a single horizontal plane, is avoided. However, pursuant to the invention, it is seen that the two above-described paths cross over one another without interfering. Thus, in the manner described above, any one of the pads in contact field 130 of boards such as board 17 can be connected to any one of the plural contact pads of any of the fields 130, on any edge of a vertically adjacent board. Additionally, many crossover paths which would electrically intersect if made in one place, can be effected by using the two-plane crossover approach.

Stack Structure

The stacking arrangement described below differs from the arrangement disclosed in the cited U.S. Pat. No. 5,049,982, in its use of the inventive RS element. That application, however, to the extent relevant, is incorporated by reference herein.

FIG. 4 shows schematically the stacking of several boards, each board mounting plural (for example, four) PEs. The stack, denoted 65, comprises three boards 17, 18, 19 for illustration; more boards, for example, four or greater, may be stacked in similar fashion. Two of the exemplary four PEs, denoted 1 and 2, are shown mounted on each of the boards 17, 18, 19.

An electrically connective compliant element 46 is sandwiched between RS elements 50 and each of the boards 17, 18, 19, 60, and 70. Element 45 conducts only in the vertical direction, to provide vertical paths. Element 45 is a material sold under the name CPI, standing for Conductive Polymer Interconnect, and is available from AT&T. Threaded devices 45, four to a stack (two are shown), secure the assembly.

The stack 65 includes a top board 60 and a bottom board 70. Boards 60, 70 serve to mechanically protect the internal stack of boards, such as boards 17-20. Further, they provide the clamping areas used to apply compressive force to secure the stack. The boards 60, 70 also implement topology-specific routing where it is necessary to realize a loop-around connection. Board 70 additionally may provide power distribution and electrical termination of selected signals. The top board 60 also provides mechanical interconnection to Input/Output boards (not shown). Board 60 also furnished clock and control distribution to the board stack and maps ports to the external world for switching in external signals.

As described above, RS element 50 provides both direct vertical as well as selective switched vertical electrical routing paths. RS elements 50 also serve to provide inter-board clearance.

As seen in the enlargement of FIG. 4, the processor chip 27, static rams 28, and communications device 29 are attached to substrate 47 by solder bumps, denoted 51. Electrical paths (not shown) on substrate 47 are connected by wires 55 from wife bond pad 30 to pad 30a in the field 130, the latter being illustrated and described already in connection with FIG. 2.

Boards 60 and 70 contain contact pad fields (not shown) on both upper and lower surfaces. The pads of the contact fields are in alignment with the contact pads of RS 50. Certain of the contact pad pairs on opposite sides of the boards 60, 70 are connected with plated-through holes. A vertical electrical loop-back path from a selected one of the contact pads on the upper surface of board 60 to a selected one of the contact pads on the lower surface of board 70 is effected by providing plated-through holes between all of the contact pad pairs in the selected vertical line and then by electrically connecting opposing contact pads with the electrically conductive material layer. The loopback path then is joined to a north port of a PE on the upper most board layer and the corresponding south port of the PE of the lower most board layer. This principle is illustrated for example in FIGS. 8–10.

Computing Architectures Realized Through the Invention

As noted above, the ports of each PE are often referred to in the art as north, east, south, and west ports, or simply "N", "E", "S", and "W". In connecting spatially adjacent tiles, it is an established convention to connect "N" to "S", and "E" to "W".

In the stacked board configuration of the present invention, routing paths from each PE to its immediately adjacent PE, as well as to PEs mounted on boards in the "upstairs" and "downstairs" directions from a given board, are necessary. As will be illustrated in the descriptions to follow of several computing architectures, the "upstairs" and "downstairs" connections are uniquely facilitated by the present invention.

In the descriptions to follow of exemplary topographies, it is to be understood that there is an RS 50 between each processor board 17–20. Accordingly, each N-S connection is effected through a RS. The loopback connections are effected through the RS 50 elements as well as the top and bottom boards 67, 70.

"1-4" Topology

Figure 7:
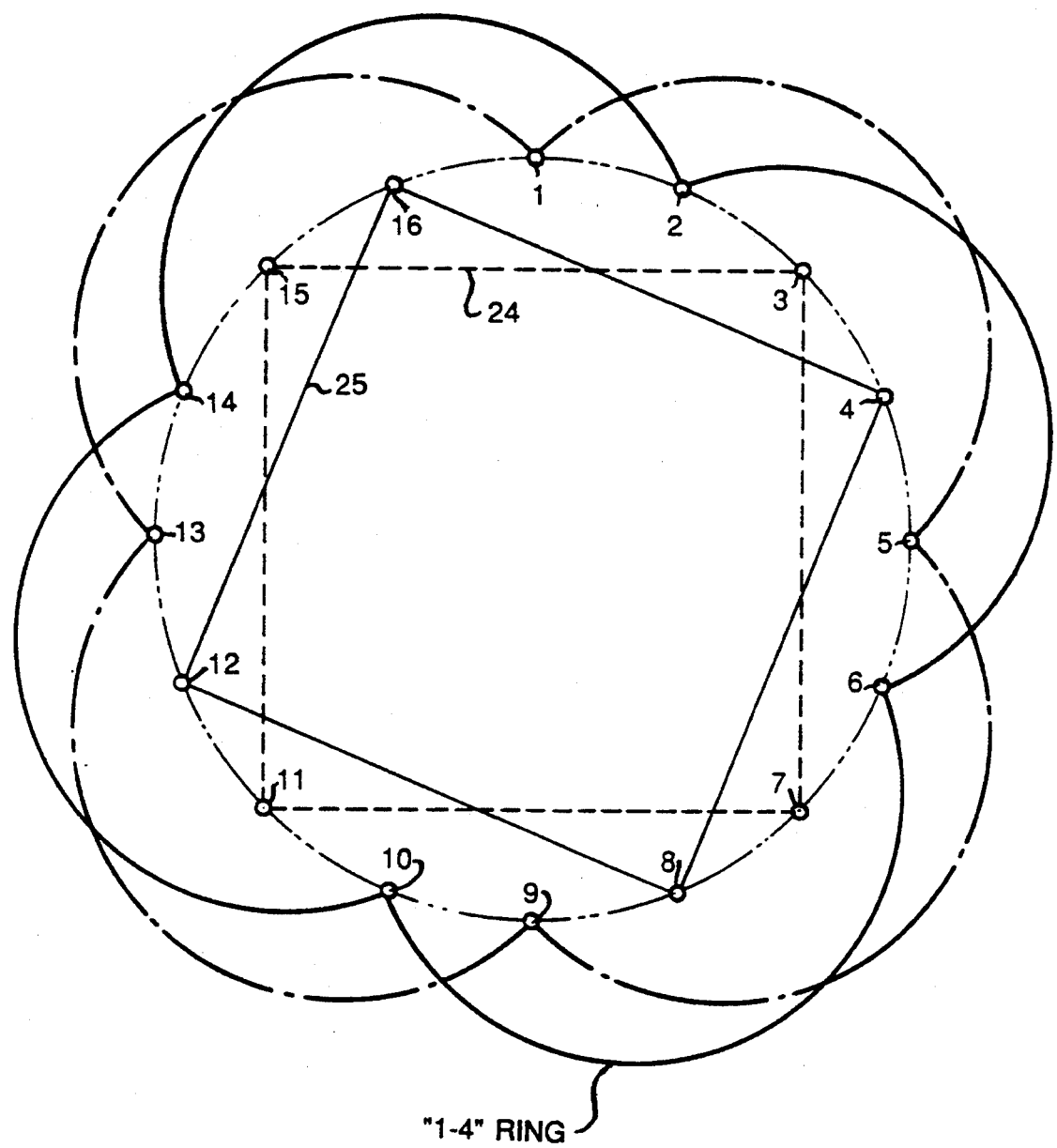
FIG. 7 is a schematic diagram, showing a ring of processing tiles connected in a "1-4" configuration.

The architecture conceptually illustrated in FIG. 7 is a "1-4" ring. In this concept, processing PEs denoted again by the numbers 1 through 16 are connected serially in a global ring, denoted 21. Four independent sub-rings are also formed by successive serial connections of every fourth PE. Sub-ring 22 thus consists of PEs 1, 5, 9, and 13. Sub-rings 23, 24 and 25 are formed with connections of PEs 2, 6, 10, 14; and PEs 3, 7, 11, 15; and PEs 4, 8, 12, 16, respectively.

Figure 8:
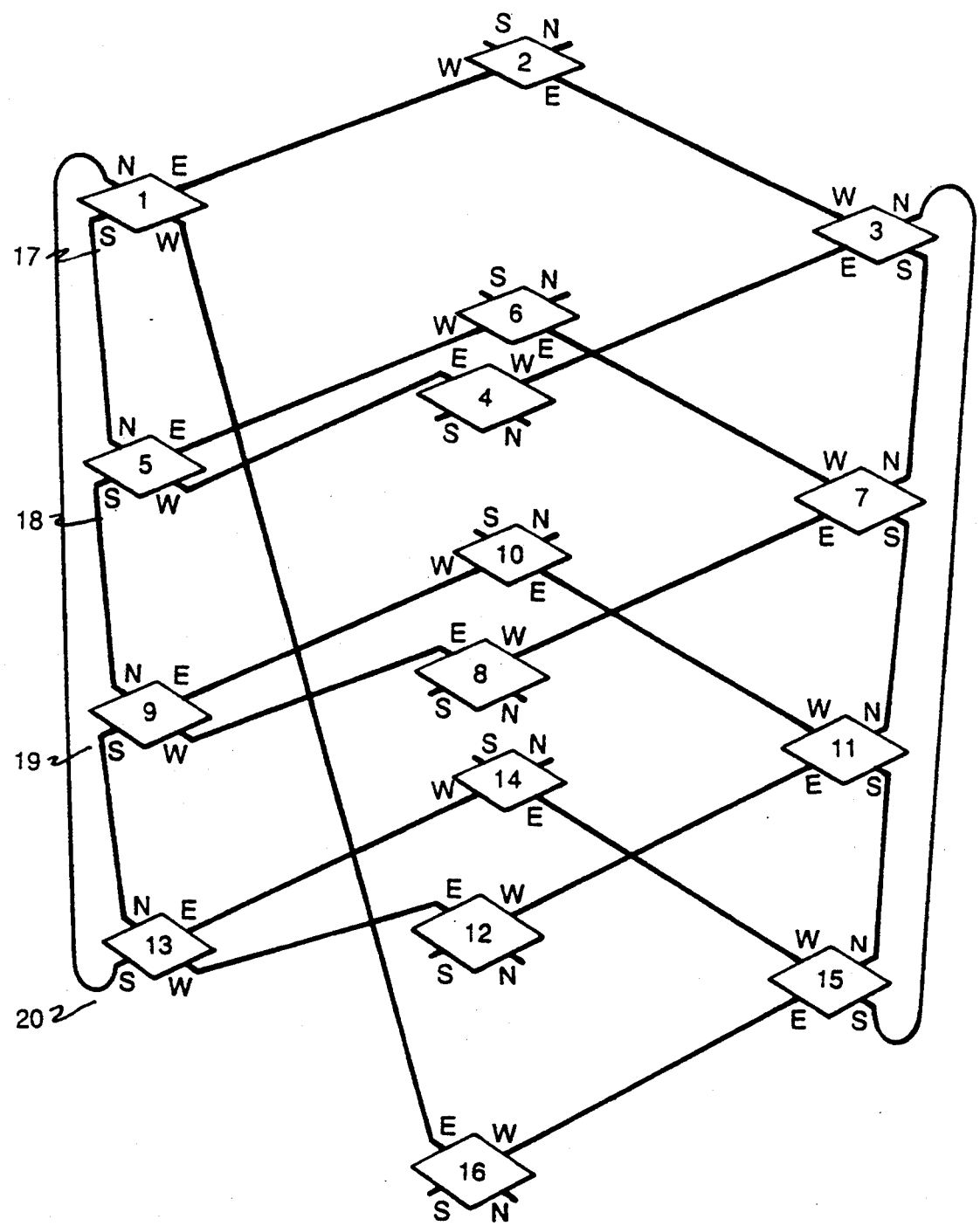
FIG. 8 is a perspective diagram of the "1-4" configuration, showing routing through stacked boards.

The "1-4" concept may be realized in the stacked board configuration of the present invention in the manner illustrated in FIG. 8. Processor boards 17, 18, 19, 20 are merely indicated in FIG. 8 by their call-out, and for the sake of clarity are not shown in detail. Board 17 mounts PEs 1, 2, 3, 4; board 18 mounts PEs 5, 6, 7, 8; board 19 mounts PEs 9, 10, 11, 12; and board 20 mounts PEs 13, 14, 15, and 16.

For purposes of the present invention of stacked processor arrays, "N" is defined as the port on each PE which communicates with its upstairs neighbor, wherein "upstairs" is the upward direction on the 3-dimensional structure of FIG. 8. These "N"-"S" connections are effected by the structure and function of the RS element 50 described above. "E"-"W" paths are effected by routing on the horizontal surfaces of the boards 17–20.

Specifically, nodes 1–16 are connected in a linear array in the first ring 21 shown in FIG. 7, through the following sequence of port connections of FIG. 8:

1E-2W; 2E-3W; 3E-4W; 4E-5W (via RS element); 5E-6W; 6E-7W; 7E-8W; 8E-9W (via RS element) 9E-10W; 10E-11W; 11E-12W; 12E-13W (via RS element) 13E-14W;14E-15W; 15E-16W; 16E-1W (via direct vertical loopback connections).

The second through fifth rings 22, 23, 24, 25 are constructed through the further sequences of port connections of FIG. 8 (only two of the 4-rings are shown in FIG. 8, for sake of clarity):

1S-5N, 5S-9N, 9S-13N (via RS element); 13S-1N (loopback) 2S-6N, 6S- 10N, 10S- 14N (via RS element); 14S-2N (loopback) 3S-7N, 7S- 11N, 11S-15N (via RS element); 15S-3N (loopback) 4S-8N, 8S-12N, 12S-16N (via RS element); 16S-4N (loopback).

Figure 11:
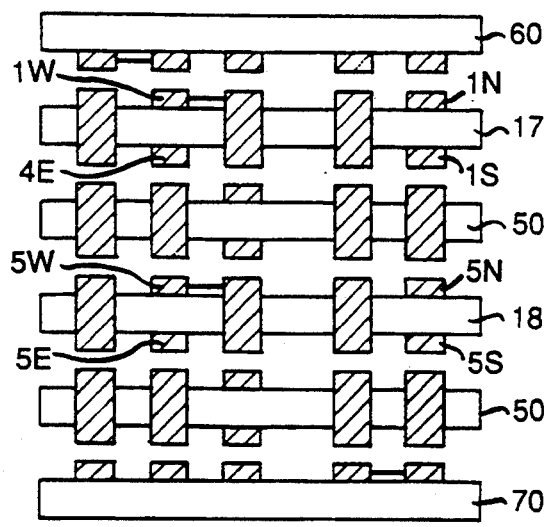
FIGS. 11, 12, and 13 are schematic diagrams of sectional plans for the 1-4 ring, the TORUS, and the rectanguloid architectures, each created with slightly different RS elements.

FIG. 11 provides a helpful understanding of the routing paths created by configuring the routing spacer in conjunction with the boards, and which achieve the 1-4 ring plan. The rings described above may be connected to a Host computer 40 by connecting a selected one of the nodes through a switch such as 39 shown in FIG. 1 to a Host computer.

"TORUS" Topology

This topology entails the connection of each of the four vertically aligned PEs through their N-S ports, creating four separate 4-port rings and the connection of each of the four PEs on each board through their E-W ports into four additional separate rings. The TORUS herein illustrated thus consists of eight separate PE rings. Two of the four intended vertical connections are shown.

Figure 9:
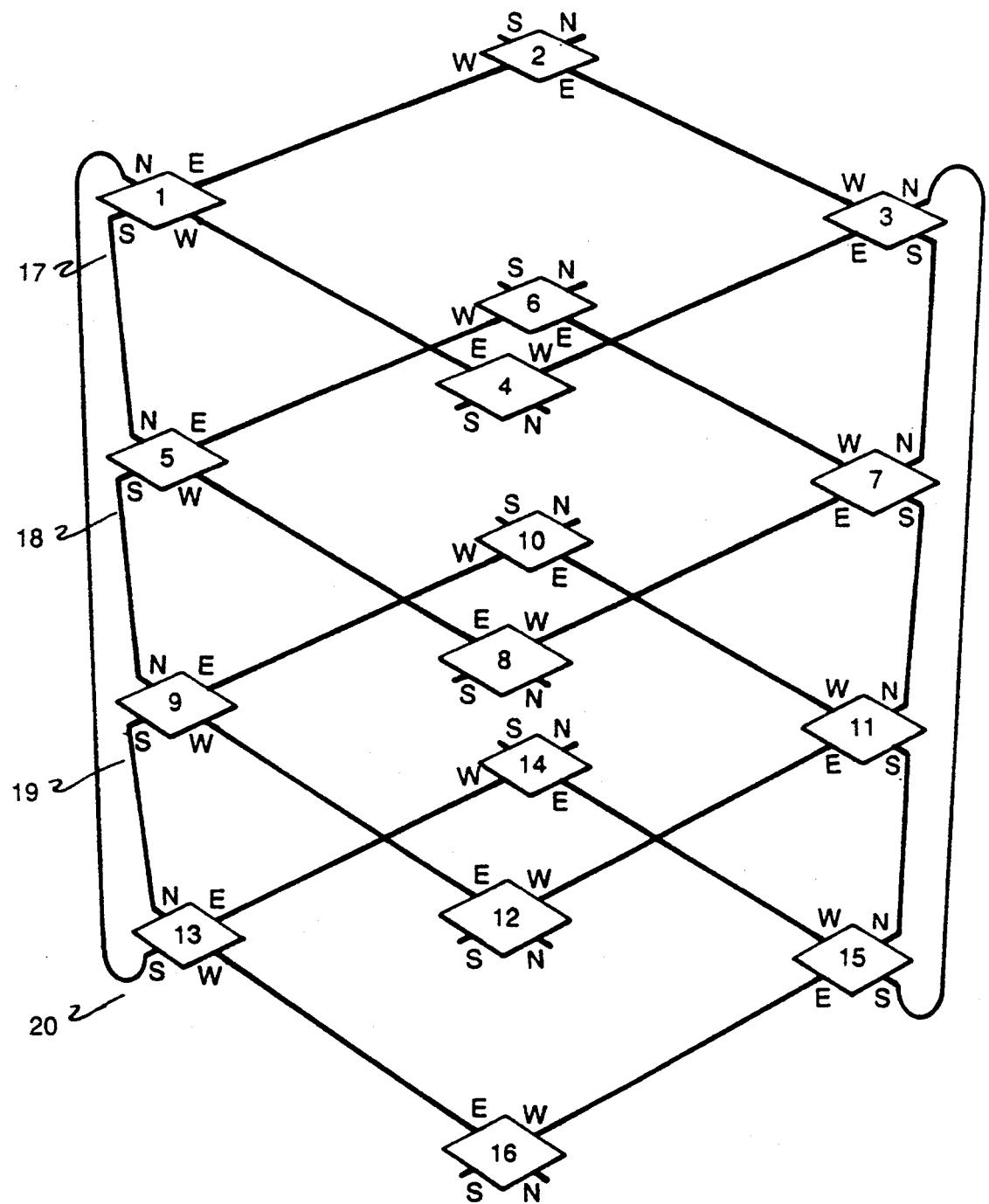
FIG. 9 is a perspective diagram of a TORUS architecture showing TORUS routing through stacked boards.
Figure 10:
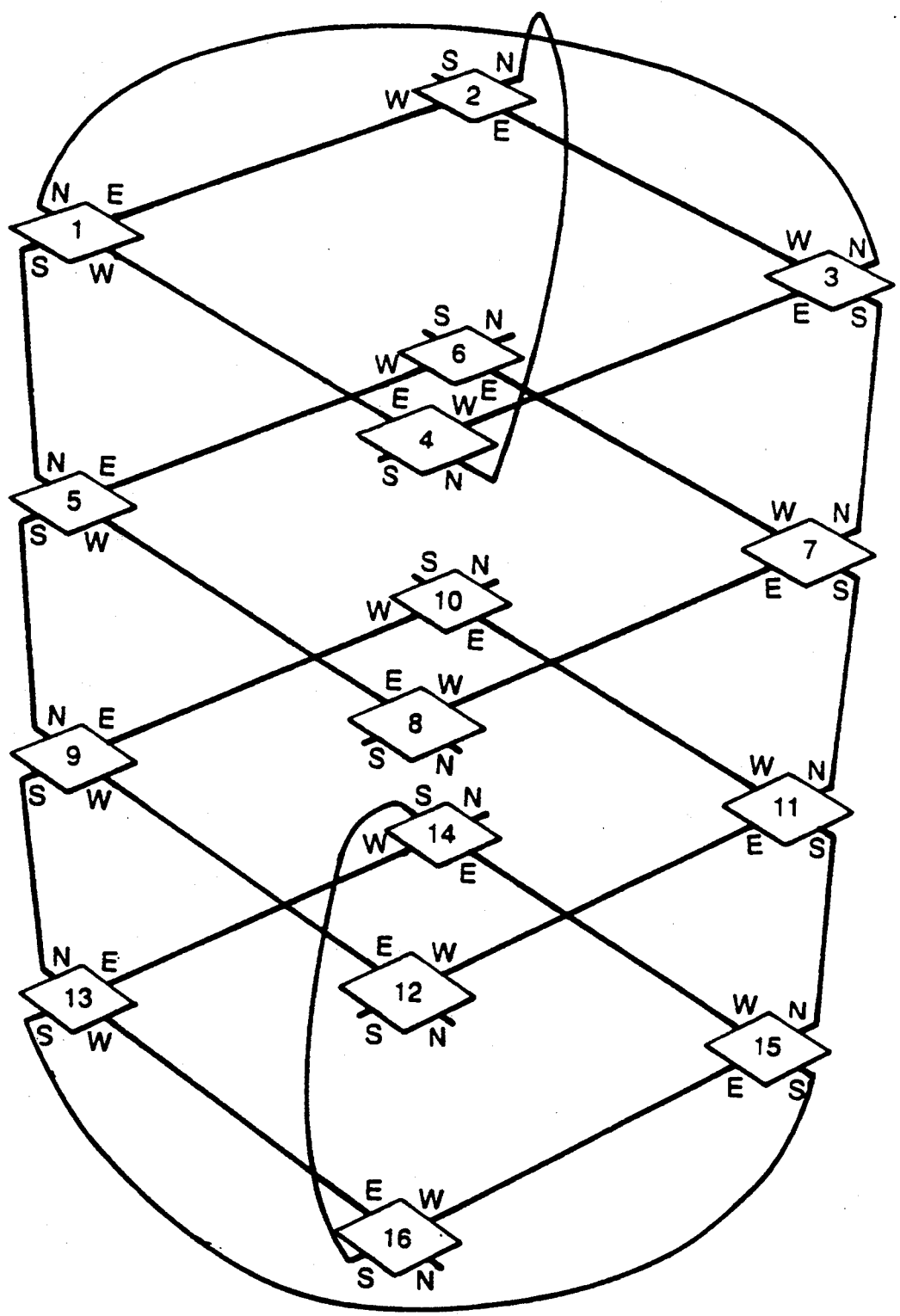
FIG. 10 is perspective diagram of a rectanguloid configuration, showing routing through stacked boards.

The vertically aligned nodes 1–16 are connected in four rings through the following sequence of port connections of FIG. 9:

1S-5N, 5S-9N, 9S-13N (via RS element); 13S-1N (loopback) 2S-6N, 6S-10N, 10S-14N (via RS element); 14S-2N (loopback) 3S-7N, 7S- I IN, 11S-15N (via RS element); 15S-3N (loopback) 4S-8N, 8S-12N, 12S-16N (via RS element); 16S-4N (loopback).

The planar nodes are connected in four further rings: 1E-2W; 2E-3W; 3E-4W; 4E- 1W; 5E-6W; 6E-7W; 7E-8W; 8E-5W; 9E-10W; 10E-11W; 11E-12W; 12E-9W; 13E-14W;14E-15W; 15E-16W; 16E-13W.

Figure 12:
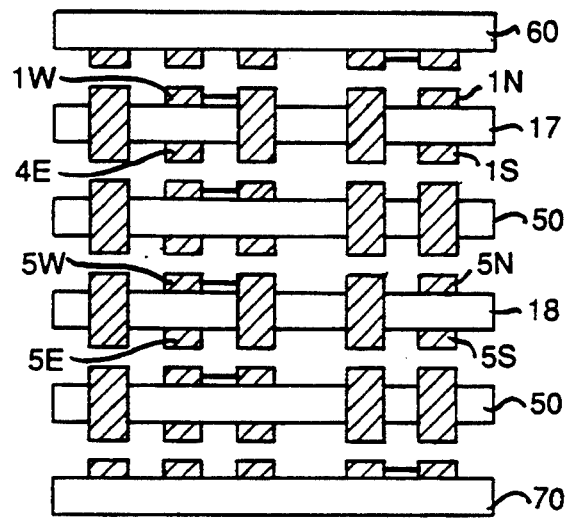

In the preceding, the following connections are effected using the RS element 50: 4E-1W; 8E-5W; 12E-9W; and 16E-13W. FIG. 12 provides some understanding of the routing paths created by configuring the routing spacer in conjunction with the boards, for the TORUS configuration. The eight rings of the TORUS array may be connected to a Host computer 40 by connecting a selected one of the nodes of each ring through a switch such as 39, as described.

Rectanguloid Configuration

FIG. 12 demonstrates how yet another computing architecture may be realized. This topology is superficially similar to that of the TORUS, except that the loopbacks are eliminated and instead the opposite corner N—N port pairs of the top board and the opposite corner S—S port pairs of the bottom board are connected. The resulting architecture comprises six rings: two have eight nodes, and four have four nodes. The complete connections are:

1S-5N, 5S-9N, 9S-13N, 13S-15S, 15S-11S, 11N-7S, 7N-3S, 3N-1N. 2S-6N, 6S-10N, 10S-14N, 14S-16S, 16N-12S, 12N-8S, 8N-4S, 4N-2N. 1E-2W; 2E-3W; 3E-4W; 4E-1W; 5E-6W; 6E-7W; 7E-8W; 8E-5W; 9E-10W; 10E-11W; 11E-12W; 12E-9W; 13E-14W;14E-15W; 15E-16W; 16E-13W.

Figure 13:
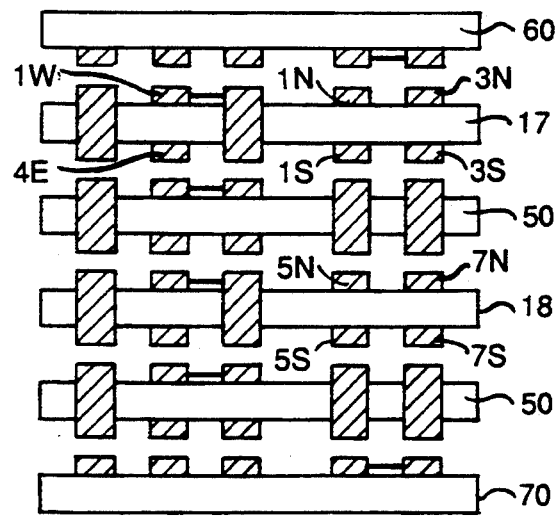

Again, the six rings of the TORUS array may be connected to a Host computer 40 by connecting a selected one of the nodes of each ring through a switch such as 39, as described. FIG. 13 provides understanding of the routing paths created by configuring the routing spacer in conjunction with the boards for the instant configuration.

The three architectures are examples of many possible stacked node configurations, which can be achieved by use of fixed geometry PEs and RS element routing pursuant to the invention.

What is claimed is:

1. Apparatus for effecting routing paths in a stacked board multiprocessor computer, comprising:
    a plurality of processing element boards (PEBs), each PEB comprising plural processing elements mounted thereon; and external contact fields including first contact pads on both sides of said PEB communicating with said elements; and
    a routing board disposed between adjacent ones of each said PEB, each said routing board comprising:
    external contact fields substantially congruent with said contact fields of said PEB;
    second contact pads on both sides of said routing board for communicating with corresponding ones of said first contact pads;
    a first set of internal circuit paths between selected opposing pairs of said second pads for direct vertical connection of selected signals between said PEBs; and
    a second set of internal circuit paths between selected non-opposing pairs of said second pads for lateral routing of selected signals between said PEBs;
    wherein said first set of internal circuit paths comprise plated-through holes through said top and bottom laminates and said insulative layer;
    wherein said second set of internal circuit paths comprise horizontal conductive paths along the boundary plane of said insulative layer and said laminates.

2. Apparatus in accordance with claim 1, wherein said processing elements are 4-sided, and each said side comprises access port connections to said processing element.

3. Apparatus in accordance with claim 2, wherein said access ports of each said processing element are north, east, south and west ports.

4. Apparatus in accordance with claim 3, further comprising:
    a Host computer;
    and wherein each said processor element comprises a digital signal processor chip;
    a communications and network controller, and
    means in each said controller for routing signals to or from said north, east, south and west ports and said Host computer.

5. Apparatus in accordance with claim 4, wherein said routing board comprises:
    top and bottom laminates;
    and an insulative layer separating said laminates;
    said second contact pads being formed on the exterior sides of said laminates.

6. Apparatus in accordance with claim 5, further comprising means including said boundary planes for effecting one or more crossover connections of said second circuit paths.

7. A stacked board multiprocessor computer, comprising:
    a plurality of processing element boards (PEBs), each PEB comprising:
    plural processing elements mounted on each PEB, each said element having 4 sides comprising respectively north, east, south and west access port connections to said processing element;
    external contact fields on both sides of said PEB;
    said fields being adjacent to each said port, each field comprising plural first contact pads;
    means for making connections from said ports to the adjacent said first contact pads;
    a routing board disposed between adjacent ones of each said PEB and comprising:
    external contact fields substantially congruent with said contact fields of said PEB, second contact pads on both sides of said routing board for communicating with corresponding ones of said first contact pads;

a first set of internal circuit paths between selected opposing pairs of said second pads for direct vertical connection of selected signals between said PEBs; and a second set of internal circuit paths between selected non-opposing pairs of said second pads for lateral routing of selected signals between said PEBs;

wherein said first set of internal circuit paths comprise plated-through holes through said top and bottom laminates and said insulative layer;

wherein said second set of internal circuit paths comprise horizontal conductive paths along the boundary plane of said insulative layer and said laminates.

8. The multiprocessor computer of claim 7 further comprising means including said first and second circuit paths for configuring said processing elements in a rectanguloid topology.

9. The multiprocessor computer of claim 8, further comprising means including said first and second circuit paths for configuring said processing elements in a 1-4 ring topology.

10. The multiprocessor computer of claim 8, further comprising means including said first and second circuit paths for configuring said processing elements in a torus topology.

11. Apparatus in accordance with claims 9, 10, or 8, wherein each said routing board comprises:

top and bottom laminates; and an insulative layer separating said laminates;

said second contact pads being formed on the exterior sides of said laminates.

12. Apparatus in accordance with claim 11, further comprising means including said boundary planes for effecting one or more crossover connections of second circuit paths.

* * * * *